(12) United States Patent
Murata et al.

(10) Patent No.: US 9,196,502 B2
(45) Date of Patent: Nov. 24, 2015

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Shotaro Murata, Aichi (JP); Kotaro Noda, Mie (JP); Satoshi Nagashima, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/195,781

(22) Filed: Mar. 3, 2014

(65) Prior Publication Data

US 2015/0076583 A1 Mar. 19, 2015

(30) Foreign Application Priority Data

Sep. 13, 2013 (JP) ................................. 2013-190602

(51) Int. Cl.
| | | |
|---|---|---|
| *H01L 27/115* | (2006.01) | |
| *H01L 21/32* | (2006.01) | |
| *H01L 29/788* | (2006.01) | |
| *H01L 21/3213* | (2006.01) | |

(52) U.S. Cl.
CPC .......... *H01L 21/32* (2013.01); *H01L 21/32139* (2013.01); *H01L 27/11524* (2013.01); *H01L 27/11565* (2013.01); *H01L 29/7881* (2013.01)

(58) Field of Classification Search
CPC ................... H01L 29/42324; H01L 29/66825; H01L 27/115; H01L 27/11521; H01L 21/28273
USPC .................................................. 257/315, 324
See application file for complete search history.

(56) References Cited

U.S. PATENT DOCUMENTS

| | | | |
|---|---|---|---|
| 2008/0179645 A1* | 7/2008 | Nakamura et al. | 257/295 |
| 2009/0078990 A1* | 3/2009 | Yasuda | 257/326 |
| 2011/0018047 A1* | 1/2011 | Komiya | 257/315 |
| 2012/0313159 A1* | 12/2012 | Sim | 257/324 |

FOREIGN PATENT DOCUMENTS

JP H0855920 A 2/1996

* cited by examiner

*Primary Examiner* — Monica D Harrison
(74) *Attorney, Agent, or Firm* — Patterson & Sheridan, LLP

(57) ABSTRACT

A semiconductor device includes a substrate and memory cell transistors having a gate electrode above the substrate, and an oxide film. The gate electrode includes a charge storage layer above the substrate, a first insulating film on the charge storage layer, and a control gate electrode on the first insulating film, the control gate electrode including a metal film. The oxide film is disposed on the metal film.

19 Claims, 8 Drawing Sheets

_US 9,196,502 B2_

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2013-190602, filed Sep. 13, 2013, the entire contents of which are incorporated herein by reference.

FIELD

Embodiments described herein relate generally to a semiconductor device and a method for manufacturing the same.

BACKGROUND

A flash memory is known as a semiconductor device. One type of the flash memory employs a gate electrode that is formed of a polycide, which is a layered structure including a silicide film and a polysilicon film, or a polymetal, which is a layered structure including a metal film and a polysilicon film. With these gate electrodes, a protective film may be provided, for example, in order to prevent oxidation of the gate electrode, or to prevent diffusion of a dopant from the gate electrode. During processing of films including the gate electrode and the protective film, a width of the protective film may become narrower as the side of the protective film is etched. In accordance with the narrowed protective film, a width of the patterned structure may become narrower, and this may cause a collapse of the pattern structure during the patterning process.

DETAILED DESCRIPTION

In general, according to one embodiment, a semiconductor device includes a substrate and a plurality of memory cell transistors having a gate electrode above the substrate, and an oxide film. The gate electrode includes a charge storage layer above the substrate, a first insulating film on the charge storage layer, and a control gate electrode on the first insulating film, the control gate electrode including a metal film. The oxide film is disposed on the metal film.

Hereinafter, a semiconductor device embodied as a NAND-type flash memory will be described with reference to the drawings, as an example. The drawings are schematic, and the relationships between thickness and plane dimensions and the like do not necessarily match actual ones. Also, the upper, lower, right, and left directions refer to relative directions assuming the device is viewed from a surface on which the circuit elements are formed, and do not necessarily match the gravitational acceleration direction.

(First Embodiment)

Figure 1:
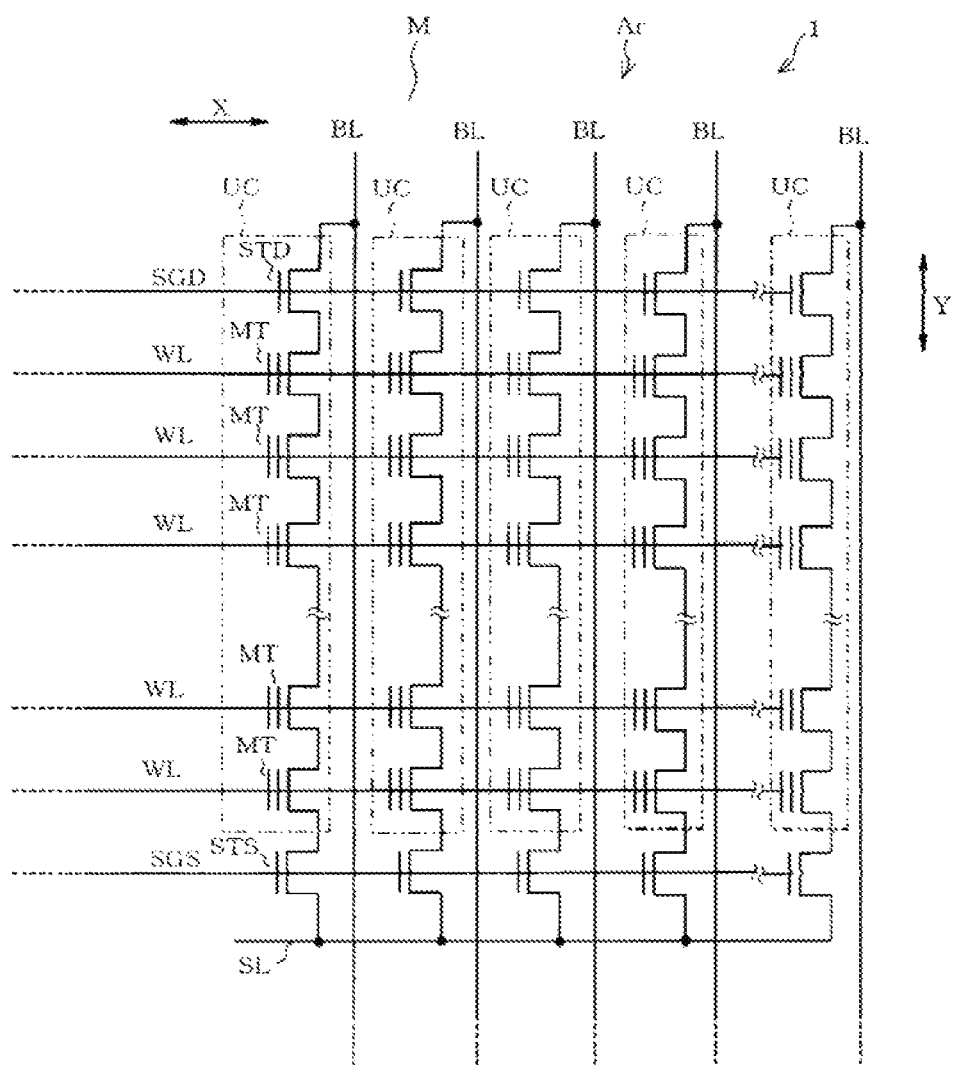
FIG. 1 schematically shows an example of an electrical configuration of a portion of a memory cell region in a semiconductor device according to a first embodiment.

FIGS. 1 to 10 correspond to a semiconductor device according to a first embodiment. FIG. 1 is a block diagram schematically showing an electrical configuration of a NAND-type flash memory as an example of the semiconductor device. As shown in FIG. 1, a NAND-type flash memory 1 includes a memory cell array Ar in which a large number of memory cells to which electrical data can be written and from which the electrical data deleted are arranged in a matrix form.

In the memory cell array Ar, which is disposed in a memory cell region M, unit memory cells UC are arranged. In each unit memory cell UC, a select gate transistor STD is provided on a bit line BL side, and a select gate transistor STS is provided on a source line SL side. Between the select gate transistors STD and STS, m (for example, $m=2^k$; 64) memory cell transistors MT are connected in series.

The unit memory cells UC constitutes a memory cell block, and the memory cell blocks constitute the memory cell array Ar. Specifically, in one block, n rows of the unit memory cells UC are arranged in parallel in a row direction (X direction in FIG. 1). In the memory cell array Ar, the blocks are arranged in the column direction (Y direction in FIG. 1). FIG. 1 shows one block for ease of explanation.

A control line SGD is connected to gates of the select gate transistors STD. Word lines WL are connected to control gates of the memory cell transistors MT, each connected to corresponding bit line BL. A control line SGS is connected to gates of the select gate transistors STS connected to the source line SL. The control line SGD, the word lines WL, the control line SGS, and the source line SL intersect with the bit lines BL. The bit lines BL are connected to sense amplifiers (not shown).

The gate electrodes of the select gate transistors STD, each disposed in one of the unit memory cells UC arranged in the row direction, are electrically connected to the control line SGD. Likewise the gate electrodes of the select gate transistor STS, each disposed in one of the unit memory cells UC arranged in the row direction, are electrically connected to the control line SGS. A source of each select gate transistor STS is connected to the source line SL in common. The gate electrodes of the memory cell transistors MT, each disposed in the unit memory cells UC arranged in the row direction, are electrically connected to one of the word lines WL.

Figure 2:
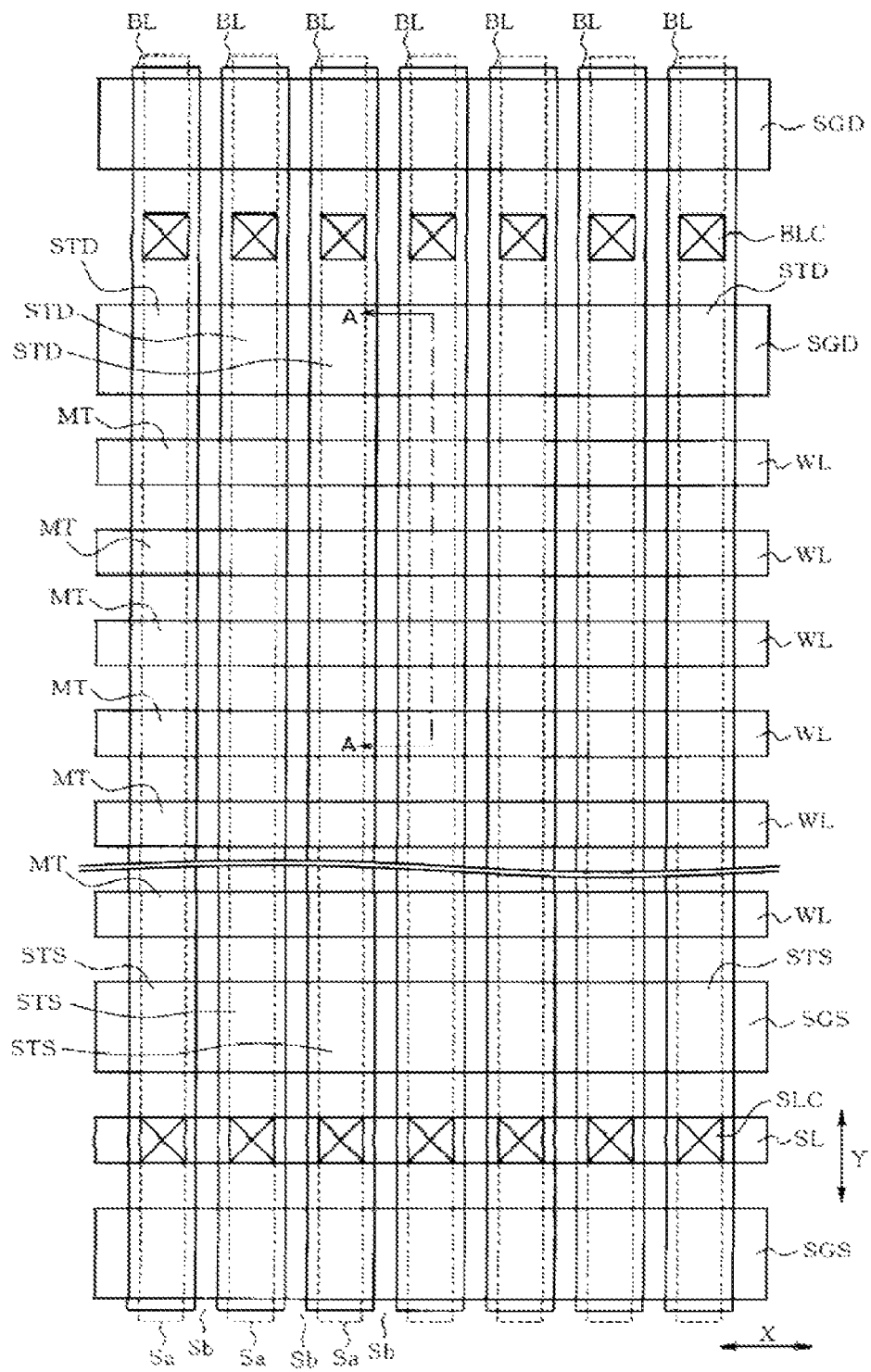
FIG. 2 is an example of a schematic plan view of the memory cell region.

FIG. 2 is a plan view schematically showing an example of a layout pattern of a portion of the memory cell region M. In FIG. 2, the source line SL, the control line SGS, the word lines WL, and the control line SGD are spaced in the Y direction, and arranged in parallel, each extending in the X direction. The bit lines BL are arranged with predetermined intervals in the X direction, and arranged in parallel, each extending in the Y direction.

Element isolation areas Sb are formed, and each extends in the Y direction as shown in FIG. 2. The element isolation areas Sb each have a shallow trench isolation (STI) structure in which an insulating film is embedded in a trench. The element isolation areas Sb are formed with predetermined intervals in the X direction. In a surface layer portion of a semiconductor substrate, an element area Sa is formed between the adjacent element isolation areas Sb, and the element areas Sa are arranged in the Y direction. That is, the element isolation areas Sb are provided between the element areas Sa, and the element isolation areas Sb separate the semiconductor substrate into the element areas Sa.

The word line WL is formed to extend in a direction orthogonal to the element areas Sa (X direction in FIG. 2). The word lines WL are formed with predetermined intervals in the Y direction in the figure. The memory cell transistor MT is arranged at an intersection of the word line WL and the element area Sa. The memory cell transistors MT adjacent to each other in the Y direction constitute a portion of a NAND string (memory cell string).

The select gate transistors STS and STD are arranged at an intersection of the control lines SGS and SGD and the element areas Sa. The select gate transistors STS and STD are provided outside the NAND string formed of the memory cell transistors MT, and each of the select gate transistors STS and STD is adjacent to one of the memory cell transistors MT that is disposed at an end of the NAND string.

The select gate transistors STS on the source line SL side are arranged in the X direction. The gate electrodes of the select gate transistors STS are electrically connected through the control line SGS. Gate electrodes SG of the select gate transistors STS are formed at intersections of the control line SGS and the element areas Sa. Source line contacts SLC are provided at intersections of the source line SL and the bit lines BL.

The select gate transistors STD are provided in the X direction as shown in FIG. 2. The gate electrodes SG of the select gate transistors STD are electrically connected through the control line SGD. The select gate transistors STD are formed at intersections of the control line SGD and the element areas Sa. Bit line contacts BLC are formed on the corresponding element areas Sa between the adjacent select gate transistors STD.

Figure 3:
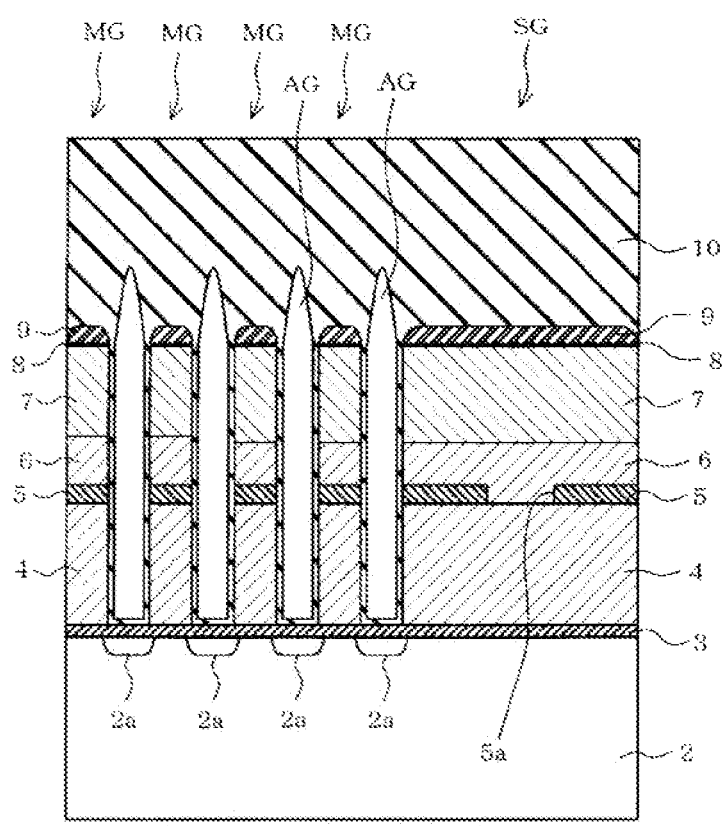
FIG. 3 is an example of a schematic longitudinal cross-sectional view of a portion along a line A-A in FIG. 2.

FIG. 3 is a cross-sectional view of a portion shown by line A-A in FIG. 2. Specifically, FIG. 3 is a cross-sectional view of the element area Sa in the Y direction, in which the gate electrodes MG and SG of the memory cell transistors MT and the select gate transistors ST in the memory cell region are arranged. In FIG. 3, a gate insulating film 3 is formed on a silicon substrate 2. For the silicon substrate 2, for example, a silicon substrate having a p-type conductivity may be used. For the gate insulating film 3, a silicon oxide film formed by thermal oxidation may be used, for example. For the gate insulating film 3, a silicon oxynitride film may be used instead.

On the gate insulating film 3, the gate electrodes MG of the memory cell transistors MT and the gate electrodes SG of the select gate transistors ST are provided. The gate electrodes MG and SG have substantially identical film-laminated structures. On the gate insulating film 3, a polysilicon film (a charge storage layer) 4, an interelectrode insulating film, a polysilicon film 6, and a tungsten film 7 are sequentially layered. The polysilicon film 6 and the tungsten film 7 together function as a control gate electrode having a so-called polymetal structure. On the tungsten film 7, a nitrided layer 8 is provided, which is formed by nitriding the top surface of the tungsten film 7. As the nitrided layer 8 is provided on the top surface of the tungsten film 7, the nitrogen concentration in a top surface region of the tungsten film 7 is higher than the nitrogen concentration in the side surface region of the tungsten film 7. Here, the tungsten film 7 is sometimes referred to as a metal gate, and the polysilicon film 6, as a poly gate.

A silicon oxide film 9 is disposed on the top surface of the nitrided layer 8. The top surface of the silicon oxide film 9 is rounded at the edges. The silicon oxide film 9 can be formed by plasma chemical vapor deposition (CVD) with a silane gas ($SiH_4$) as material gas. Alternatively, the silicon oxide film 9 may be a silicon oxynitride film containing nitrogen in a fixed ratio. The charge storage layer 4 is not limited to single layer of a polysilicon film, and may have a structure in which a trap-type insulating film, polysilicon, and a trap-type insulating film are layered. For the interelectrode insulating film 5, a layered film such as an oxide-nitride-oxide (ONO) film or a nitride-oxide-nitride-oxide-nitride (NONON) film, for example, may be used. Alternatively, the interelectrode insulating film 5 can be formed with a layered film including a silicon-containing hafnium oxide film (HfSiO), a silicon oxide film ($SiO_2$), alumina ($Al_2O_3$), a silicon oxynitride film (SiON), and a silicon nitride film (SiN), for example.

At the gate electrode SG of the select gate transistor ST, an opening 5a is formed in the interelectrode insulating film 5, and the polysilicon film 4 and the polysilicon film 6 are in contact with each other. Thus, the polysilicon film 4 and the polysilicon film 6 are electrically connected. For the tungsten film 7, a different metal film such as a film of nickel (Ni), cobalt (Co), or aluminum (Al) may be used.

An interlayer insulating film (second insulating film) 10, which is made of a silicon oxide film, is formed on the top surfaces of the gate electrodes MG and SG. For the interlayer insulating film 10, a silicon oxide film is formed under conditions where embedding property is poor. Thus, the interlayer insulating film 10 is deposited so as to form a bridge between the tops of the gate electrodes MG and SG. As a result, a space is formed between the adjacent gate electrodes MG and between the gate electrodes MG and SG. The space between the adjacent gate electrodes MG and between the gate electrodes MG and SG is referred to as an air gap AG, in which a vacuum, air, or the like is disposed, and functions as a dielectric. Upper end portions of the air gaps AG, i.e., portions that is in contact with lower surface portions of the interlayer insulating film 10 between the adjacent gate electrodes MG and between the gate electrodes MG and SG are protruded and higher than the top surface of the silicon oxide film 9 disposed on the top surface of the gate electrodes MG. The dielectric constant of the air gaps AG is lower than the dielectric constant of the silicon oxide film and the like, so that coupling capacitance between the adjacent gate electrodes MG and between MG and SG can be reduced. In a surface layer region of the silicon substrate 2, dopant diffusion areas 2a are formed as source and drain regions by introducing dopants into the regions between the adjacent gate electrodes MG and between the gate electrodes MG and SG.

According to the above-described configuration, the silicon oxide film 9 is provided on the nitrided layer 8, which is formed on the top surface of the tungsten film 7. As the silicon oxide film 9 is not likely to constrict during processing, the side surface of the tungsten film 7 can be formed substantially upright with an obtuse taper angle. As a result, the width of the tungsten film 7 can remain thick after the processing, and increase in the electrical resistance of the control gate electrodes can be prevented.

Further, as the nitrided layer 8 is formed by nitriding the top surface of the tungsten film 7, the oxide film 9 can be more firmly adhered to the tungsten film 7. This can prevent the oxide film 9 from peeling off and prevent oxidation of the tungsten film 7.

Moreover, as the silicon oxide film 9 is provided on the tungsten film 7, the interlayer insulating film 10 is deposited on the silicon oxide film 9. This allows the upper end portions of the air gaps Ag to be higher than the top surface of the tungsten film 7. As a result, coupling capacitance between the adjacent gate electrodes MG and between MG and SG can be reduced.

Next, a process for manufacturing the semiconductor device having the above-described configuration will be described with reference to FIGS. 4 to 10. FIGS. 4 to 10 show steps of the manufacturing process of the portion shown by the line A-A in FIG. 2. In the description below, other steps may be added between the steps, and the steps may be interchanged as necessary when practically possible.

Figure 4:
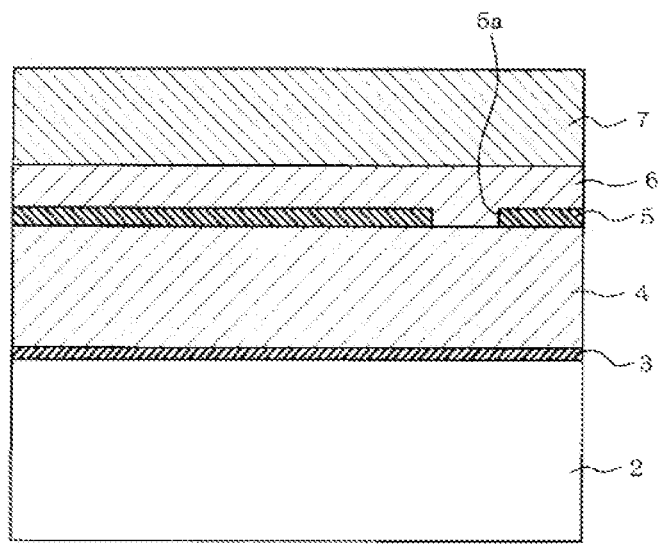
FIGS. 4-10 are each an example of a schematic longitudinal cross-sectional view of the portion along the line A-A in FIG. 2 during a step of a manufacturing process.

First, a configuration in FIG. 4 and steps leading to this configuration will be described. In FIG. 4, on the silicon substrate 2, the gate insulating film 3, the polysilicon film 4, the interelectrode insulating film 5, the polysilicon film 6, and the tungsten film 7 are formed in this order. In the manufacturing process, the element areas Sa and the element isolation areas Sb are formed after the gate insulating film 3 and a portion of the polysilicon film 4 are formed.

For the gate insulating film 3, a silicon oxide film formed by a thermal oxidation method, or a silicon oxynitride film formed by an oxynitriding method may be used, for example. The gate insulating film 3 is formed so as to have a thickness of about 5 nm to 7 nm, for example. Then, the polysilicon film 4 is formed by CVD, for example. Further, the polysilicon film 4 is doped with boron, for example, as dopants. Introduction of dopants into the polysilicon film 4 can be performed by ion implantation after formation of an undoped polysilicon film, for example. Alternatively, for the introduction of dopants into the polysilicon film 4, dopants can be introduced while a polysilicon film is formed.

Thereafter, the element isolation areas Sb shown in FIG. 2 are formed. A mask film used for processing is formed on the top surface of the polysilicon film 4. Using the mask film, by reactive ion etching (RIE), the polysilicon film 4 and the gate insulating film 3 are etched, and further the silicon substrate 2 is etched to a predetermined depth to form device isolation trenches. Thereafter, a silicon oxide film is embedded into the device isolation trenches. The silicon oxide film can be formed by applying an application liquid such as polysilazane, followed by heat treatment, for example. Leaving portion of the silicon oxide film formed in the device isolation trenches, other portions are removed by chemical mechanical polishing (CMP) or the like and then planarized. Subsequently, the silicon oxide film left in the device isolation trenches is adjusted to a predetermined height by an etch back processing or the like. Accordingly, the surface of the silicon substrate 2 is divided by the element isolation areas Sb in the X direction in FIG. 2, and areas between the element isolation areas Sb are formed as the element areas Sa.

Next, the mask film is removed, and then an additional polysilicon film is deposited on the partially-formed polysilicon film 4. First, the interelectrode insulating film 5 is formed on the polysilicon film 4. An ONO film or the like may be used for the interelectrode insulating film 5 as described above. Thereafter, a part of the polysilicon film 6 (lower portion) is formed on the top surface of the interelectrode insulating film 5. Next, the lower portion of the polysilicon film 6 and the interelectrode insulating film 5 is etched by photolithography and an opening is formed in the interelectrode insulating film 5. The opening 5a is formed for a transistor not having a floating gate electrode such as the select gate transistor ST and a transistor in a peripheral circuit. The opening 5a is formed so as to be located at the center of the gate electrode SG of the select gate transistor ST in the X direction shown in FIG. 3. The opening 5a extends in the Y direction over the gate electrodes SG are arranged in the Y direction.

Thereafter, as shown in FIG. 4, additional polysilicon film (upper portion of the polysilicon film 6) is formed on the polysilicon film 6. At a portion of the gate electrode SG, the polysilicon film 4 and the polysilicon film 6 are physically in contact and electrically connected through the opening 5a. Further, the tungsten film 7 is formed on the polysilicon film 6. The tungsten film 7 is formed by sputtering, for example. Through the above-described processes, the structure shown in FIG. 4 is formed.

Figure 5:
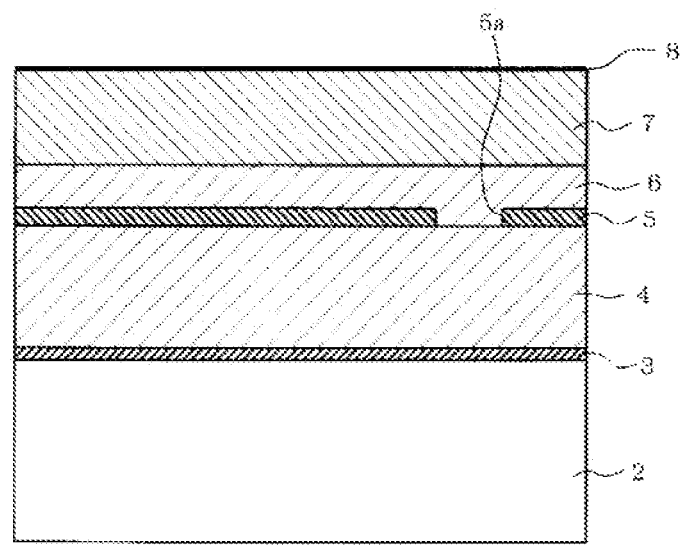

Next, as shown in FIG. 5, the nitrided layer 8 is formed at the surface region of the tungsten film 7. Here, the nitrided layer 8 is formed by nitriding the surface region of the tungsten film 7, for example. The nitriding of the surface region of the tungsten film 7 is performed by feeding nitrogen into a chamber such that the tungsten film 7 is exposed to a nitrogen atmosphere and performing heat treatment on the tungsten film 7 in this state, for example. Alternatively, for nitriding, plasma nitriding, slot plane antenna (SPA) nitriding, selective nitriding, or the like may be used. As the nitrided layer 8 is on the top surface region of the tungsten film 7, the nitrogen concentration in a top surface region of the tungsten film 7 is higher than the nitrogen concentration in other regions of the tungsten film 7.

Figure 6:
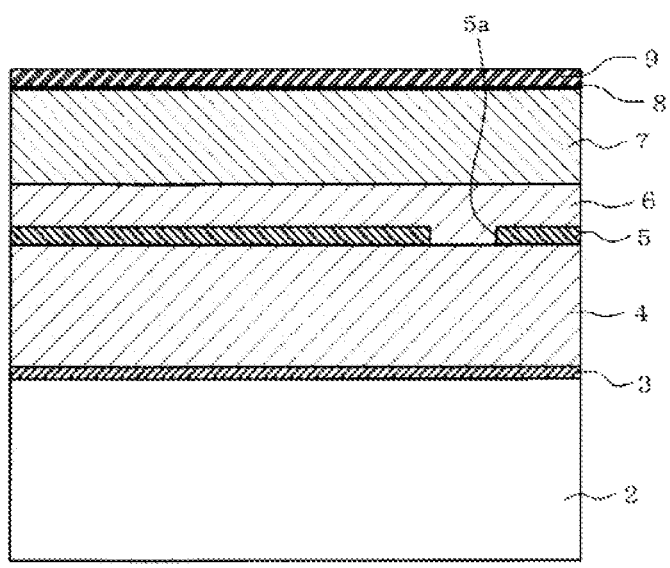

Next, as shown in FIG. 6, the silicon oxide film (protective film) 9 is formed on the nitrided layer 8. In this case, the silicon oxide film 9 may be formed by a plasma CVD process, in which a silane gas ($SiH_4$) is fed in a plasma. In this process, nitrogen may be introduced at a fixed rate during formation of the silicon oxide film 9 so that a silicon oxynitride film is formed as the silicon oxide film 9. As the nitrided layer 8 is formed between the tungsten film 7 and the silicon oxide film 9, the silicon oxide film 9 can be firmly adhered to the tungsten film 7.

Figure 7:
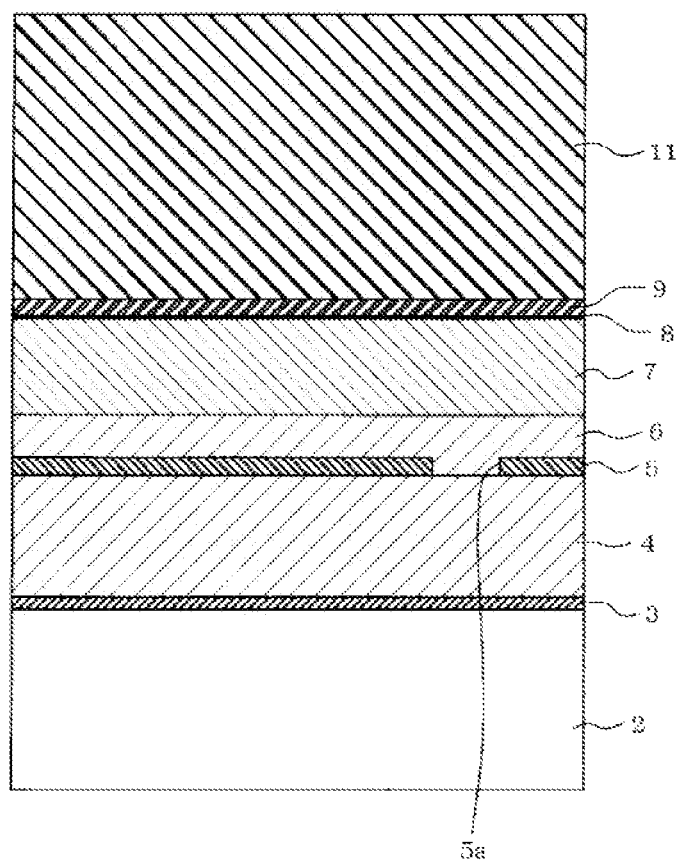

Next, as shown in FIG. 7, an insulating film. 11 as a mask layer is formed so as to have a predetermined film thickness. Here, for convenience of explanation, only a single layer of the insulating film 11 is shown as the mask layer. However, when the insulating film 11 is patterned using a sidewall transfer technique, films for forming the mask layer are further formed on the insulating film 11. By conducting the sidewall transfer technique once or twice, a pattern finer than the finest possible pattern created by photolithography can be formed.

Figure 8:
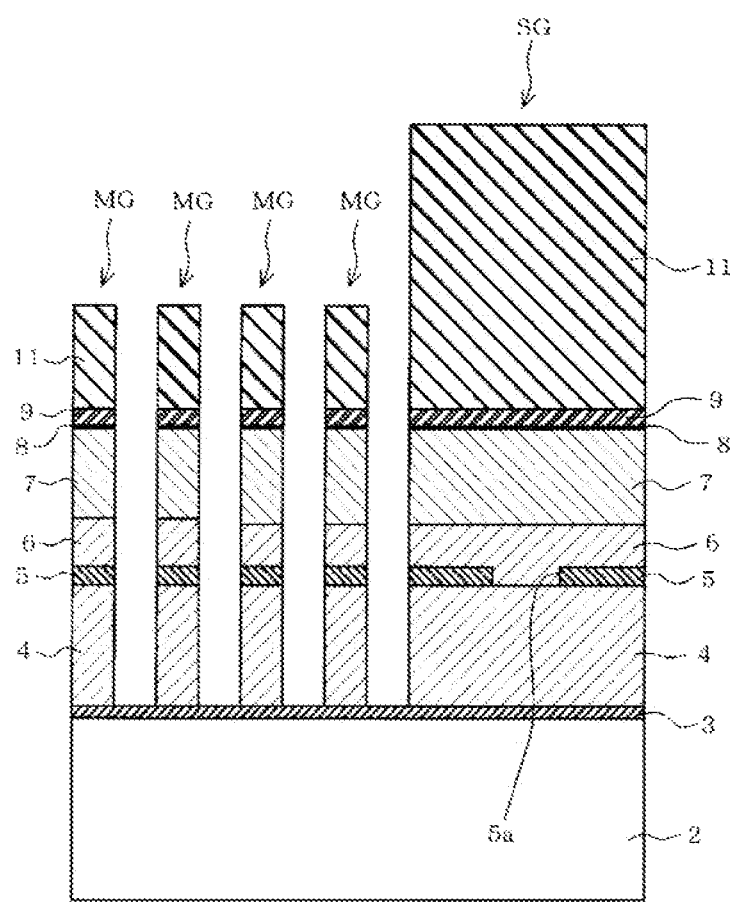

Next, as shown in FIG. 8, the insulating film 11 is patterned so that a hard mask is formed. Then, with the insulating film 11 as a mask, gate processing is performed by RIE. In the gate processing, using anisotropic etching, the silicon oxide film 9, the nitrided layer 8, the tungsten film 7, the polysilicon film 6, the interelectrode insulating film 5, and the polysilicon film 4 are sequentially processed from the top. As a result, the gate electrodes MG and SG are formed. Further, through this step gate electrodes of transistors in a peripheral circuit (not shown) can be simultaneously formed.

At this time, during the etching, the silicon oxide film 9, which is formed as a protective film for the tungsten film 7, can be processed without constriction, unlike a silicon nitride film. For example, when a CF-based gas is used during the processing of the tungsten film 7, the side surfaces of a silicon nitride film are also etched. On the other hand, in the embodiment, the silicon oxide film 9 is used, and the side surfaces of the silicon oxide film 9 resist the etching. This allows the tungsten film 7, the polysilicon film 6, the interelectrode insulating film 5, and the polysilicon film 4 to be etched substantially vertically. As the width of the tungsten film 7 is prevented from becoming smaller due to constriction of the protective film, the resistance of the tungsten film 7 can be prevented from decreasing. The silicon oxide film 9 is formed on the tungsten film 7 the nitrided layer 8 therebetween. This results in increased adhesion between the tungsten film 7 and the silicon oxide film 9, and thus the silicon oxide film 9 can be prevented from peeling off during the gate processing. As shown in FIG. 8, after the gate processing, the height of the insulating film 11 on the gate electrodes MG of the memory cell transistors MT is reduced.

Figure 9:
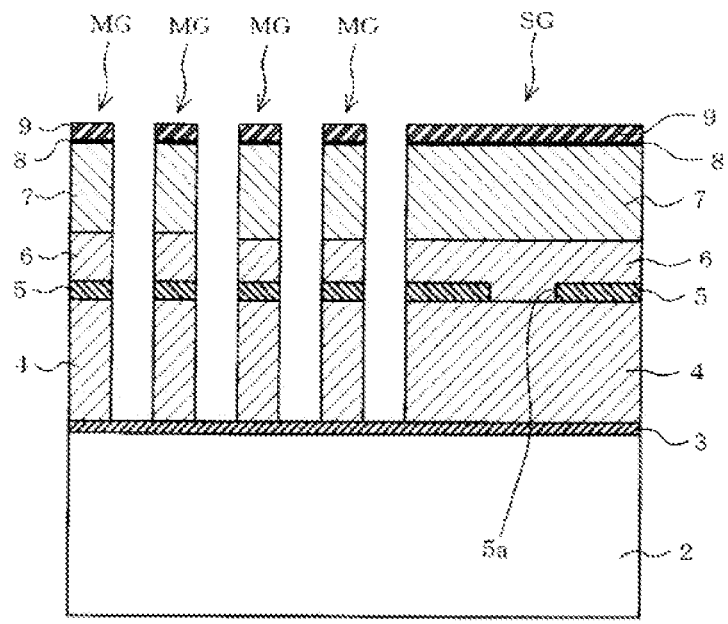

Next, as shown in FIG. 9, the insulating film 11 is removed by wet processing, for example. In this state, the silicon oxide film 9 formed under the insulating film 11 remains. Subsequently, a cleaning after treatment using a hydrofluoric acid-based chemical solution is performed. Here, by adjusting conditions of the cleaning treatment, the silicon oxide film 9 can be left above the tungsten film 7. In addition, the silicon oxide film 9 is slightly etched and reduced in thickness than before the cleaning after treatment, and is rounded at the edges as show in FIG. 10.

Figure 10:
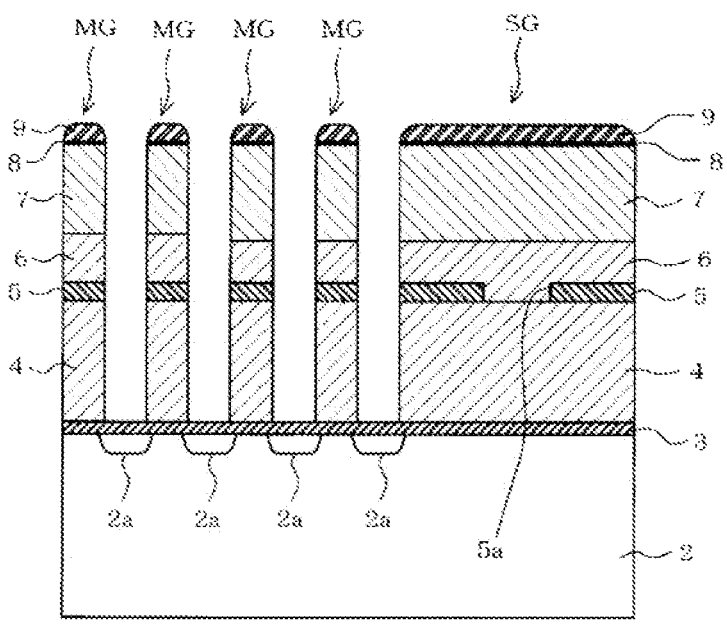

Thereafter, using ion implantation, dopants are implanted into the surface region of the silicon substrate 2 exposed between the adjacent gate electrodes MG and between the gate electrodes MG and SG of the memory cell transistors MT and the select gate transistors ST. As a result, the N-type dopant diffusion areas 2a (having a low dopant density) is formed as shown in FIG. 10, and this areas function as source and drain regions in the silicon substrate 2. For the dopants introduced by ion implantation, phosphorus (P) or arsenic (As) may be used, for example.

Subsequently, as shown in FIG. 3, the interlayer insulating film 10 is formed. For the interlayer insulating film 10, a silicon oxide film may be used, for example. The interlayer insulating film 10 is formed under conditions where a covering property is poor, using a plasma CVD process, for example. As portions of the interlayer insulating film 10 depositing on the top surfaces of the gate electrodes MG during its formation are brought into contact with each other, the material of the interlayer insulating film 10 only slightly enters the gap between the gate electrodes MG and MG and between the gate electrodes MG and SG.

That is, the gaps between the adjacent gate electrodes MG and between the gate electrodes MG and SG are not entirely embedded with the material of the interlayer insulating film 10. Thus, and the interlayer insulating film 10 can be formed to be a bridge between the gate electrodes MG and SG and over the gaps. As a result, the gaps between the adjacent gate electrodes MG and between the gate electrodes MG and SG constitute the air gaps AG. As the air gaps AG has a low dielectric constant, coupling capacitance between the adjacent gate electrodes MG and between the gate electrodes MG and SG can be reduced.

Thereafter, through a contact formation step, a wiring step, or the like, a chip of the NAND-type flash memory 1 according to the embodiment is formed.

In the embodiment like this, the nitrided layer 8 is provided in the top surface region of the tungsten film 7, and the silicon oxide film 9 is provided on the nitrided layer 8. This can prevent constriction of the silicon oxide film 9 during the gate processing even with a fine pattern using the sidewall transfer technique. Further, during the gate processing, the side surfaces of the tungsten film 7 can be formed substantially upright. As a result, the tungsten film 7 can be prevented from being reduced in width, and thus resistance of the tungsten film 7 can be prevented from being increased.

The nitrided layer 8 is provided by nitriding the top surface region of the tungsten film 7 to be a metal gate. This can increase adhesion between the tungsten film 7 and the oxide film 9 formed on the nitrided layer 8. As a result, the silicon oxide film 9 can be prevented from peeling off, and the tungsten film 7 can be prevented from being oxidized. Further, the provision of the silicon oxide film 9 can protect the nitrided layer 8 during processing.

Moreover, as the silicon oxide film 9 is formed on the nitride layer 8, the upper end portions of the air gaps AG formed in the interlayer insulating film 10 are located higher than the top surface of the tungsten film 7. In other words, the lower surface of the interlayer insulating film 10, which is the portion contacting the upper end portions of the air gaps AG formed between the adjacent gate electrodes MG or between the gate electrodes MG and SG, is located higher than the top surface of the tungsten film 7. This air gap AG can reduce the coupling capacitance between the adjacent gate electrodes MG and between the gate electrodes MG and SG.

Further, as the silicon oxide film 9 is formed on the tungsten film 7, dopant diffusion from the tungsten film 7 can be prevented.

Moreover, as the nitrogen concentration in the top surface region of the tungsten film 7 is higher than the nitrogen concentration in the other regions (such as the side surface regions) of the tungsten film 7, the adhesion to the silicon oxide film 9 can be increased, while the entire amount of nitride in the tungsten film 7 is maintained low. As a result, the resistance of the tungsten film 7 can be maintained low.

Generally, in the steps of forming a fine pattern, processability can be increased, and the NAND-type flash memory 1 with preferable characteristics can be obtained.

(Other Embodiments)

Other than those described in the embodiments, the following modifications are possible.

Although the semiconductor device according to the above-described embodiments are applied to the NAND-type flash memory 1, the semiconductor device of the present disclosure may also be applied to nonvolatile semiconductor memories such as a NOR-type flash memory and an EEPROM. Further, the semiconductor device of the present disclosure are applicable to both a memory in which a memory cell is configured to store one bit and a memory in which a memory cell is configured to store a plurality of bits.

As a metal film, a metal film other than the tungsten film 7 may be used. Alternatively, a silicide film may be used.

The embodiments are applicable to a step of forming a fine pattern even when the sidewall transfer technique is not used.

The embodiments are applicable to cases where the side transfer technique is performed once, twice, or more times.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate; and
   a plurality of memory cell transistors each having a gate electrode above the semiconductor substrate,
   wherein each of the gate electrodes comprises:
      a charge storage layer formed above the semiconductor substrate;
      a first insulating film formed on the charge storage layer; and
      a control gate electrode formed on the first insulating film, the control gate electrode including a metal film containing nitrogen, and an oxide film formed on a top surface of the metal film.

2. The device according to claim 1, wherein
   the oxide film contains nitrogen.

3. The device according to claim 1, further comprising:
a second insulating film covering the memory cell transistors with air gaps between gates of the memory cell transistors.

4. The device according to claim 3, wherein the air gaps extend above the top surface of the metal film.

5. The device according to claim 1, wherein
nitrogen concentration in the top surface of the metal film is higher than nitrogen concentration in side surfaces thereof.

6. The semiconductor device according to claim 1, wherein the metal film contains tungsten.

7. The device according to claim 1, wherein the control gate electrodes are separated by an air gap.

8. A semiconductor device comprising:
a substrate;
a plurality of memory cell transistors connected in series along a first direction, each memory cell transistor having a gate electrode disposed above the substrate, wherein each of the gate electrodes comprises:
a charge storage layer above the substrate,
a first insulating film formed on the charge storage layer, and
a control gate electrode formed on the first insulating film; and
a metal layer disposed above the control gate electrodes, the metal layer having a width in the first direction that is substantially the same as a width of each of the control gate electrodes.

9. The semiconductor device according to claim 8, wherein the metal layer includes tungsten.

10. The semiconductor device according to claim 9, wherein the metal layer is nitrided.

11. The semiconductor device according to claim 8, further comprising:
an oxide film disposed above the metal layer.

12. The semiconductor device according to claim 11, wherein the oxide film has a width in the first direction that is substantially the same as a width of the control gate electrodes.

13. The semiconductor device according to claim 8, further comprising:
a second insulating film covering the memory cell transistors with air gaps between gates of the memory cell transistors.

14. The semiconductor device according to claim 13, wherein the air gaps extend above the top surface of the metal layer.

15. The semiconductor device according to claim 8, wherein the control gate electrodes are separated by an air gap.

16. A method for manufacturing a semiconductor device, comprising:
forming a gate insulating film, a first film, a first insulating film, and a metal film above a semiconductor substrate;
forming an oxide film above the metal film;
forming a patterned mask layer above the oxide film;
patterning the oxide film, the metal film, the second conductive film, the first insulating film, and the first conductive film, using the patterned mask; and
nitridinq a surface region of the metal film, wherein the oxide film is formed on the surface region of the metal film, and a concentration of nitrogen in the surface region of the metal film is greater than a concentration of nitrogen in a region of the metal film that is below the surface region.

17. The method according to claim 16, wherein the forming the oxide film comprises exposing the metal film to a silane gas ($SiH_4$) in a plasma CVD process.

18. The method according to claim 16, further comprising:
forming a second insulating film to cover the patterned oxide film with air gaps between the patterned metal film.

19. The method according to claim 16, further comprising forming an air gap on a side of the first film, the first insulating film, and the metal film.

* * * * *